Figure 1:
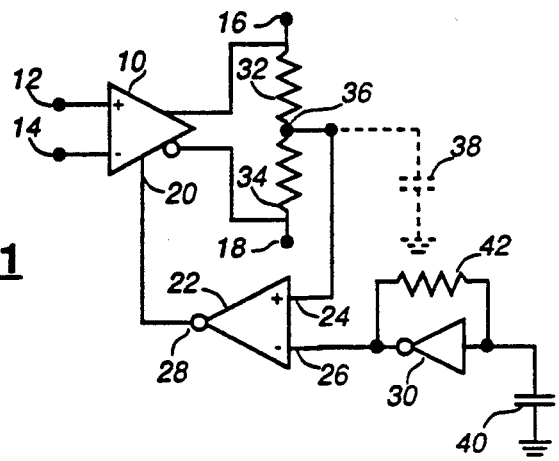

United States Patent [19]

Wolczanski

[11] Patent Number: 5,077,496
[45] Date of Patent: Dec. 31, 1991

[54] LOGIC TRACKING INTERFACE CIRCUIT

[75] Inventor: John A. Wolczanski, Carp, Canada

[73] Assignee: Northern Telecom Limited, Montreal, Canada

[21] Appl. No.: 524,399

[22] Filed: May 11, 1990

[51] Int. Cl.[5] ............... H03K 19/0175; H03K 3/01
[52] U.S. Cl. ..................... 307/475; 307/443; 307/450; 307/355; 307/362; 307/296.4
[58] Field of Search ............ 307/443, 448, 450, 362, 307/355, 475, 530, 359, 296.4

[56] References Cited

U.S. PATENT DOCUMENTS

| | | | |
|---|---|---|---|
| 4,419,595 | 12/1983 | Reiner | 307/355 |
| 4,612,463 | 9/1986 | Kikachi | 307/475 |
| 4,638,255 | 1/1987 | Penney | 307/359 |
| 4,763,021 | 8/1988 | Stickel | 307/475 |
| 4,791,318 | 12/1988 | Lewis et al. | 307/475 |
| 4,890,014 | 12/1989 | Ramet | 307/355 |

Primary Examiner—Stanley D. Miller
Assistant Examiner—Margaret Rose Wambach
Attorney, Agent, or Firm—Dallas F. Smith

[57] ABSTRACT

A logic tracking interface circuit includes a signal comparator, a feedback comparator and a logic gate of the type to be driven by the interface circuit. The mean of the inverting and noninverting outputs of the signal comparator is applied as an input to the feedback comparator, the other input being provided by the logic gate. The inverted output of the feedback comparator is used to control the common mode of the signal comparator.

13 Claims, 1 Drawing Sheet

LOGIC TRACKING INTERFACE CIRCUIT

This invention relates to logic tracking interface circuits and is particularly concerned with such circuits for high-speed or critical timing applications.

Interface circuits are used whenever data has to enter or leave an integrated circuit or within an integrated circuit when different logic families are used.

A known form of input circuit is based on a comparator which has as inputs the incoming signal and either a reference voltage or a complementary incoming signal. The output or outputs from the comparator then drive the logic internal to the integrated circuit through appropriate level shift devices.

For an application in which high-speed or critical timing is required, the common-mode output of the comparator must be minimized. For a range of input voltages, common-mode output may cause the complementary outputs from the comparator to be both high or both low. This may lead to timing distortion of a time-varying input.

A known method of reducing the effects of common-mode output is the use of common-mode feedback. With common-mode feedback, the mean of the inverting and non-inverting outputs from the comparator is used to control the comparator. However, this method may suffer from sensitivity to power supply and manufacturing process variations. This sensitivity arises from the fact that any changes in the logic levels will change the value of the mean and cannot be differentiated from changes in the common-mode output.

An object of the present invention is to provide an improved logic tracking interface circuit.

In accordance with an aspect of the present invention there is provided a logic tracking interface circuit, comprising a signal comparator means having first and second inputs and first and second outputs, a potential divider connected between the first and second outputs of the signal comparator means for proving a mean signal value, a logic gate means of the type to be driven by the logic tracking interface circuit, and a feedback comparator means, having first and second inputs and an output, connected to the potential divider, the logic gate means output and the control input, respectively, for controlling the signal comparator means.

In accordance with another aspect of the present invention there is provided a logic tracking interface circuit, comprising a first comparator means providing first and second outputs, a logic gate means of the type to be driven by the logic tracking interface circuit for providing a decision level output, and a second comparator means for controlling the signal comparator means in response to a mean of the output signals of the first comparator and the decision level output of the logic gate means.

In accordance with a further aspect of the present invention there is provided a method of interfacing logic, comprising the steps of: comparing two input levels to provide inverted and noninverted output levels, comparing a mean of the output levels with a logic gate output level to provide a control signal, and changing the output levels in response to the control signal.

An advantage of the present invention is its accommodation of process variations and temperature and supply voltage fluctuations.

According to the present invention a second comparator, a feedback comparator, is provided which compares the mean output from the signal comparator with the decision voltage obtained from a sample logic gate of the type being driven by the input circuit.

Figure 2:
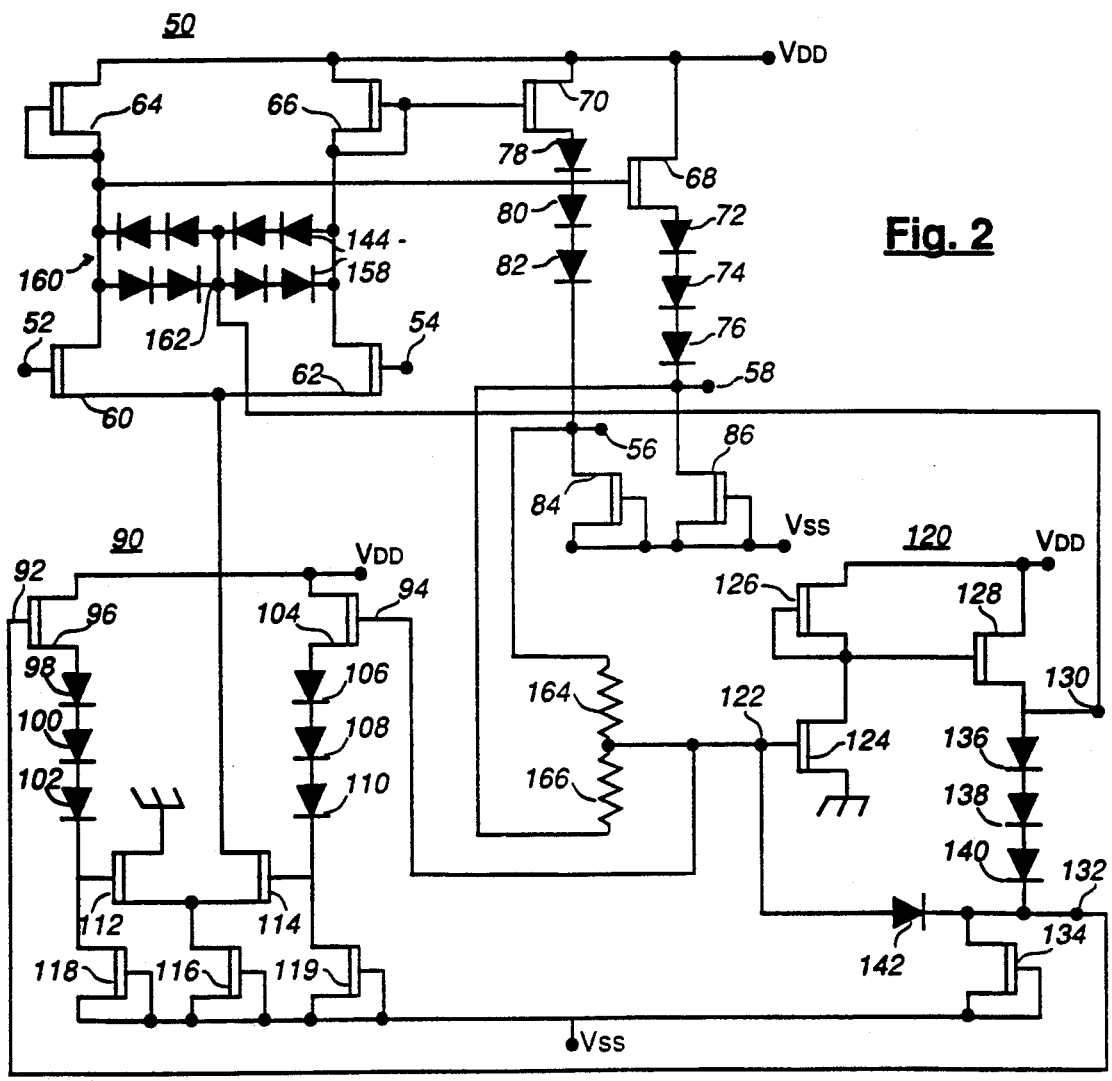

The present invention will be further understood from the following description with reference to the drawings in which:

FIG. 1 schematically illustrates a logic tracking interface circuit in accordance with a first embodiment of the present invention; and FIG. 2 schematically illustrates a logic tracking interface circuit in accordance with a second embodiment of the present invention.

Referring to FIG. 1, there is illustrated an embodiment in accordance with the present invention including a signal comparator 10, having positive and negative inputs 12 and 14, respectively, noninverting and inverting outputs 16 and 18, respectively, and common-mode control input 20, a feedback comparator 22 having positive and negative inputs 24 and 26, respectively, and an inverting output 28 and an inverting logic gate 30. Ideally, the signal comparator 10 includes level shifters (not shown in FIG. 1) to produce appropriate output levels. A pair of resistors 32 and 34 are serially connected between the outputs 16 and 18 of the signal comparator 10. A junction 36 between the resistors 32 and 34 is connected to the positive input 24 of the feedback comparator 22. An optional capacitor 38 (shown in broken line) may be connected between the junction 36 and ground. The negative input 26 of the feedback comparator 22 is connected to the output of the inverting logic gate 30. The inverting output 28 of the feedback comparator 22 is connected to the common-mode control input 20 of the signal comparator 10. The input of the inverting logic gate 30 is connected via a capacitor 40 to ground. A resistor 42 is connected between the input and output of the inverting logic gate 30.

In operation, the resistors 32 and 34 are used to obtain a mean of the signal levels at outputs 16 and 18 of the signal comparator 10. The mean is then input to the feedback comparator 22. The other input to the feedback comparator 22 is provided by the inverting logic gate 30 with feedback to produce a steady output of its decision level (i.e. that voltage for which the inverted output equals the input causing it). The inverted output 28 of the feedback comparator 22 drives the common-mode control 20 of the signal comparator 10. Suppose that the signal comparator 10 produces outputs with a high bias (i.e. both outputs high during part of the input transition), then the mean output level fed into the feedback comparator 22 turns down the common-mode of the signal comparator 10. Similarly, a low common mode will result in the common-mode being increased by the feedback comparator 22.

The advantage of this circuit over conventional common-mode feedback can be seen when variations in the logic due to temperature, supply voltage or processing are considered. In this case, the actual decision level is fed into the feedback comparator 22 and adjusts the common mode of the signal comparator 10 to realign the output signals.

As long as the high and low levels coming from the signal comparator 10 are the same for both the noninverted and inverted outputs 16 and 18, the operation of this circuit does not depend on any property of the input signal. To work properly, the decision level must be equal to the mean of the high and low signal levels; if this is not the case a certain amount of overdrive must be provided by the outputs from the signal comparator 10.

A second embodiment in accordance with the present invention is schematically illustrated in FIG. 2. An ECL to BFL logic tracking input circuit is provided using depletion-mode GaAs MESFET technology. The circuit includes a signal comparator 50, a feedback comparator 90 and a BFL inverting logic gate 120. The signal comparator 50 includes inputs 52 and 54 and outputs 56 and 58. To the inputs 52 and 54 may be applied either data and a reference voltage or differential data. The inputs 52 and 54 are connected to gates of a differential MESFET pair 60 and 62, respectively. Current source corrected MESFETs 64 and 66 are loads which convert changes in MESFET 60 and 62 currents, respectively, to voltages changes. Source followers 68 and 70 provide current gain, and outputs are level shifted by connection via diode chains 72, 74, 76 and 78, 80, 82, respectively, to MESFET pulldown current sources 84 and 86, respectively. The outputs 56 and 58 are noninverting and inverting, respectively.

The feedback comparator 90 has inputs 92 and 94 which are buffered and level shifted by a MESFET 96 and diodes 98, 100 and 102, and MESFET 104 and diodes 106, 108, and 110, respectively, before being applied to a differential pair of MESFETs 112 and 114. The differential pair 112 and 114 direct a portion of current from a current source MESFET 116 to common sources of the differential pair 60 and 62 of the signal comparator 50. The differential pair 112 and 114 are also connected to MESFET pulldown current sources 118 an 119, respectively.

The BFC inverting logic gate 120 is of the type used internally in the circuit interfaced by the logic tracking circuit. The BFC inverting logic gate 120 includes an input 122 connected to a gate of MESFET 124. A current source corrected MESFET 126 acts as a load which converts changes in the MESFET 124 current to voltage changes. A source follower MESFET 128 provides current gain and is connected to an output 130. A level shifted output 132 is provided by connection of the output 130 to a MESFET pulldown current source 134 via diodes 136, 138, and 140, the output 132 being connected between the diode 140 and the MESFET 134. A diode 142 is arranged as the stabilizing capacitor, connected between the input 122 and the output 132, in place of the capacitor 40 of FIG. 1. Connecting the diode 142 to the output 132 rather than to ground as shown in FIG. 1 increases its effective capacitance due to the Miller effect, thereby allowing the use of a physically smaller diode. Diodes 144 to 158 form a clamp circuit 160 having a junction 162, between the differential pair 60 and 62 of the signal comparator 50. Resistors 164 and 166 are series connected between the noninverting and inverting outputs 56 and 58 of the signal comparator 50. The mean or common-mode output component is taken from the junction between the resistors 164 and 166, and is applied to the input 122 of the BFL inverting logic gate 120.

The input 122 of the BFL inverting gate 120 is also connected to the input 94 to the MESFET 104. The unshifted output 130 of the BFL inverting gate 120 is connected to the junction 162 of the clamping circuit 160. Connection of the output 128 to the differential pair 60 and 62 via the clamp circuit 160 limits the unshifted output levels to within two forward diode drops of the potential of the output 130. The output 132 of the BFL inverting gate 120 is connected to the input 92 of the MESFET 96. Connecting the BFL inverting logic gate 120 in this manner instead of as shown in FIG. 1, allows its gain to be added to that of the feedback comparator 90, resulting in a circuit less sensitive to process and power supply variations.

In operation, suppose that a perturbation results in the potential at the junction between the resistors 164 and 166 rising. This rising potential causes a fall in the potential of outputs 130 and 132 of the BFL inverting logic gate 120. Reducing the potential at the output 130 lowers the output levels of the differential pair 60 and 62 via the clamping effect, but the loop gain in this path is only that of the BFC inverter. A higher potential value at the junction between the resistors 164 and 166 and a lower value at the output 132 of the BFL inverting logic gate 120 when applied to the feedback comparator 90 increases the portion of the current from the current source MESFET 116 that is fed to the signal comparator 50. The action of increasing the current to the differential pair of MESFETs 112 and 114 is to lower the common-mode voltage. The clamping circuit 160 prevents static levels from deviating from their desired values, so the major effect of the current control is to adjust the behaviour during signal changes, minimizing the time when both outputs are in the same state and thereby improving the high frequency performance of the interface.

While the embodiment of FIG. 2 uses depletion mode GaAs MESFET technology, depletion mode metal silicon field effect transistor technology may be used.

Numerous modifications, variations and adaptations may be made to the particular embodiments of the invention described above without departing from the scope of the invention, which is defined in the claims.

What is claimed is:

1. A logic tracking interface circuit comprising:
   a signal comparator means having first and second signal inputs, a control input, and first and second outputs;
   a potential divider, connected between the first and second outputs of the signal comparator means, for providing a means signal value; and
   a feedback comparator means, having first and second inputs and an output, the first input of the feedback comparator means being connected to the potential divider for receiving the means signal value from said signal comparator means and the output of the feedback comparator means being connected to the control input of said signal comparator means;
   wherein the second input of the feedback comparator means is connected to a sample logic gate of a type being driven by said interface circuit for providing a decision level.

2. A circuit as claimed in claim 1 wherein the logic gate means includes an inverting logic gate.

3. A circuit as claimed in claim 2 wherein the inverting logic gate has a feedback resistor connected between its input and output.

4. A circuit as claimed in claim 3 wherein the input of the inverting logic gate is capacitively coupled to ground.

5. A circuit as claimed in claim 3 wherein the input of the inverting logic gate is capacitively coupled via a forward biased diode to the feedback comparator means.

6. A circuit as claimed in claim 3 wherein the signal comparator means includes output level shifting means.

7. A circuit as claimed in claim 6 wherein the first input of the feedback comparator means is capacitively coupled to ground.

8. A circuit as claimed in claim 2 wherein the signal comparator means includes depletion mode metal silicon field effect transistors.

9. A circuit as claimed in claim 6 wherein the feedback comparator means includes depletion mode metal silicon field effect transistors.

10. A circuit as claimed in claim 6 wherein the inverting logic gate means includes depletion mode metal silicon field effect transistors.

11. A circuit as claimed in claim 2 wherein the signal comparator means includes depletion mode GaAs MESFETs.

12. A circuit as claimed in claim 6 wherein the feedback comparator means includes depletion mode GaAs MESFETs.

13. A circuit as claimed in claim 6 wherein the inverting logic gate means includes depletion mode GaAs MESFETs.

* * * * *